United States Patent
Tosa et al.

(10) Patent No.: US 7,105,070 B2
(45) Date of Patent: Sep. 12, 2006

(54) METHOD FOR PRODUCING CERAMIC SUBSTRATE, AND CERAMIC SUBSTRATE

(75) Inventors: Akifumi Tosa, Aichi (JP); Jun Otsuka, Aichi (JP); Manabu Sato, Aichi (JP); Hisahito Kashima, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 10/935,164

(22) Filed: Sep. 8, 2004

(65) Prior Publication Data
US 2005/0051253 A1 Mar. 10, 2005

(30) Foreign Application Priority Data
Sep. 9, 2003 (JP) ............................. 2003-316789
Sep. 9, 2003 (JP) ............................. 2003-316790
Sep. 9, 2003 (JP) ............................. 2003-317145

(51) Int. Cl.
B32B 37/06 (2006.01)
B32B 38/10 (2006.01)
C03B 29/00 (2006.01)
H05K 3/26 (2006.01)
H05K 3/46 (2006.01)

(52) U.S. Cl. ................... 156/89.12; 156/89.16
(58) Field of Classification Search ............. 156/89.12, 156/89.16
See application file for complete search history.

(56) References Cited

U.S. PATENT DOCUMENTS

| | | | |
|---|---|---|---|
| 5,130,067 A | 7/1992 | Flaitz et al. | |
| 5,254,191 A | 10/1993 | Mikeska et al. | |
| 5,370,759 A * | 12/1994 | Hakotani et al. | 156/73.1 |
| 5,387,474 A | 2/1995 | Mikeska et al. | |
| 5,474,741 A * | 12/1995 | Mikeska et al. | 427/376.7 |
| 5,662,755 A * | 9/1997 | Miura et al. | 156/89.15 |
| 6,139,666 A * | 10/2000 | Fasano et al. | 156/85 |
| 6,228,196 B1 * | 5/2001 | Sakamoto et al. | 156/89.17 |
| 6,696,139 B1 * | 2/2004 | Sugaya et al. | 428/210 |
| 2002/0050316 A1 * | 5/2002 | Sakamoto et al. | 156/89.12 |
| 2003/0062111 A1 * | 4/2003 | Moriya | 156/89.12 |
| 2003/0168150 A1 * | 9/2003 | Lee et al. | 156/89.12 |

FOREIGN PATENT DOCUMENTS

JP 62-260777 A 11/1987

(Continued)

Primary Examiner—Melvin Mayes
(74) Attorney, Agent, or Firm—Sughrue Mion, PLLC

(57) ABSTRACT

A method for producing a ceramic substrate which employs a cofiring process using restraint sheets in which a second ceramic green sheet 7 is laminated on a green ceramic substrate 30 so as to cover surface conductors 32 of the green ceramic substrate 30, the second ceramic green sheet 7 subsequently being integrated with the green ceramic substrate 30. Restraint sheets 9, which are not sintered at a sintering temperature at which the green ceramic substrate 30 is sintered, are laminated on corresponding opposite sides of the green ceramic substrate 30 so as to restrain the green ceramic substrate 30 together with the second ceramic green sheet 7. The second ceramic green sheet 7 and the green ceramic substrate 30 are fired at a temperature at which the second ceramic green sheet 7 and the green ceramic substrate 30 are integrally sintered, whereas the restraint sheets 9 are not sintered, to thereby yield a ceramic substrate 40. The restraint sheets 9 and a ceramic covering layer 7a which covers the surface conductors 32 are removed, to thereby expose the surface conductor layer 32. A plating layer 31 is formed on the surface conductor layer 32.

21 Claims, 4 Drawing Sheets

FOREIGN PATENT DOCUMENTS

| | | | |
|---|---|---|---|
| JP | 4-243978 A | | 9/1992 |
| JP | 5-343851 | * | 12/1993 |
| JP | 6-152134 | * | 5/1994 |
| JP | 7-86739 | * | 3/1995 |
| JP | 10-218675 | * | 8/1998 |
| JP | 2001-111223 | * | 4/2001 |
| JP | 2002-16361 | * | 1/2002 |
| JP | 2002-164653 | * | 6/2002 |
| JP | 2002-198646 | * | 7/2002 |
| JP | 2002-198647 | * | 7/2002 |
| JP | 2003-290043 | * | 10/2002 |
| JP | 2003-48782 | * | 2/2003 |
| JP | 2003-78245 | * | 3/2003 |
| JP | 2003-110238 | * | 4/2003 |
| JP | 2003-249416 A | | 9/2003 |
| KR | 2003004576 A | * | 1/2003 |

* cited by examiner

METHOD FOR PRODUCING CERAMIC SUBSTRATE, AND CERAMIC SUBSTRATE

BACKGROUND OF THE INVENTION

1. Field of the Invention

The present invention relates to a method for producing a ceramic substrate having a surface conductor layer by means of a cofiring process, and to a ceramic substrate produced by the method. More specifically, the present invention relates to a method which is advantageously employed for producing a ceramic substrate that is an assembly of ceramic components and is to be divided into a plurality of ceramic components.

2. Description of the Related Art

In a cofiring process: ceramic green sheets and conductor layers are laminated to thereby form a green ceramic substrate; subsequently, the ceramic bodies and the conductors are cofired to thereby yield a ceramic substrate. In comparison with a postfiring process in which a pattern formed of a conductive paste is printed on a ceramic substrate formed through firing, and then the printed pattern formed of a conductive paste is baked onto the ceramic substrate, the cofiring process is highly advantageous in that surface conductors, such as mounting pads, and a ceramic body can be formed in a collective manner.

However, because the green sheets and the conductor layers shrink at different times in the course of firing, the cofiring process yields a ceramic substrate that is prone to suffer from firing strain, such as warpage. Firing strain is well known to cause defects, such as a defectively mounted condition, in a mounting process.

In order to solve the problem of firing strain, various methods have been proposed. According to a typical known method, a green ceramic substrate is fired while being physically restrained from vertically opposite directions. This allows firing shrinkage to arise predominantly in the thickness direction (Z direction), thereby yielding a ceramic substrate having small firing strain. Specific methods include a method in which a green ceramic substrate is fired while being restrained by means of application of pressure from vertically opposite directions (Patent Document 1 mentioned below) and a method in which a green ceramic substrate is fired while being sandwiched between restraint sheets, which do not shrink in the course of firing, and, after the firing process, the restraint sheets are removed (Patent Document 2 mentioned below).

[Patent Document 1] Japanese Patent Application Laid-Open (kokai) No. 62-260777

[Patent Document 2] Japanese Patent Application Laid-Open (kokai) No. 4-243978

3. Problems to be Solved by the Invention

In the method in which a green ceramic substrate is fired while being restrained from vertically opposite directions by use of restraint sheets (Patent Document 2 mentioned above), a restraint sheet is in direct contact with surface conductors, such as mounting pads, formed on the surface of the substrate. Thus, this method possibly involves the following problems: unfavorable surface roughness is transferred onto the surface of the surface conductor layer; foreign matter adheres to the surface of the surface conductor layer; and a plating property and solder wettability of the surface conductor layer are deteriorated. In the method in which a green ceramic substrate is fired while being sandwiched between restraint sheets, which do not shrink in the course of firing, and, after the firing process, the restraint sheets are removed, a problem arises when a thick surface conductor layer is formed (for example, a thickness of 15 µm to 50 µm as measured after firing) in order to impart high bonding strength and solder leaching resistance to the surface conductors. Specifically, surface roughness of the surface conductor layer having an increased thickness causes a restraint sheet to partially fail to be bonded sufficiently to the surface conductor layer. As a result, firing strain is likely to arise in such an insufficiently restrained portion.

The postfiring process may be used to form the surface conductor layer. However, the number of firing operations increases. Also, the postfiring process is unsuited for formation of fine patterns. In the case where the plating process is used to form the surface conductor layer, bonding between the ceramic body and the plating layer becomes insufficient. Also, because a photolithographic process is required, the overall process becomes complicated.

SUMMARY OF THE INVENTION

It is therefore an object of the present invention to provide a method for producing a ceramic substrate which employs a cofiring process using restraint sheets and in which firing strain can be minimized while transfer of undesirable surface roughness onto surface conductors, adhesion of foreign matter to the surface conductors, and deterioration in plating property and solder wettability of the surface conductors are prevented, as well as a ceramic substrate produced by the above method.

The above object of the present invention has been achieved by providing (1) a method for producing a ceramic substrate comprising a substrate fabrication step of fabricating a green ceramic substrate comprising a laminate of ceramic green sheets and conductor layers, and surface conductors formed on a main surface of the laminate; a covering step of applying a ceramic paste to the green ceramic substrate so as to cover the surface conductors and the main surface of the laminate, the ceramic paste subsequently being integrated with the ceramic green sheets by means of cofiring; a restraining step of laminating a restraint sheet on each of opposite sides of the green ceramic substrate to which the ceramic paste has been applied, so as to restrain the green ceramic substrate, the restraint sheets containing a predominant amount of a sintering-resistant inorganic material, which is not sintered at a sintering temperature at which the green ceramic substrate is sintered; a firing step of firing the green ceramic substrate under restraint at a temperature at which the green ceramic substrate is sintered, whereas the restraint sheets are not sintered, to thereby yield a ceramic substrate restrained by means of the restraint sheets; and a removing step of removing, from the ceramic substrate restrained by means of the restraint sheets, the restraint sheets and a ceramic covering layer which is an upper portion of a ceramic layer formed from the ceramic paste applied in the covering step and which covers the surface conductors, to thereby expose the surface conductors.

According to the above method (1) of the present invention, the green ceramic substrate and the ceramic paste coating layer, which is laminated on the green ceramic substrate, are fired while being sandwiched between the restraint sheets. Thus, firing shrinkage in an XY-plane direction (in a plane) is restrained, and firing shrinkage in the Z direction (in the thickness direction) becomes predominant, thereby reducing firing strain (warpage). Since the ceramic paste coating layer intervenes between the surface conductors and the restraint sheet, surface roughness of the restraint sheet is not transferred onto the surface conductors. The ceramic paste coating layer fills a region of the main surface of the green ceramic substrate (also called the "substrate body") where the surface conductors are absent. This allows, during the sintering process, a restraining force to be exerted uniformly in a plane. Accordingly, firing strain occurring in a plane becomes more uniform, whereby the overall firing strain can be further reduced. As a result of cofiring, the ceramic paste coating layer is integrated with the substrate body. Thus, after firing, a ceramic covering layer that covers the surface conductors must be removed together with the restraint sheets. In the removing step, foreign matter (specifically, ceramic particles and the like) adhering to the surface conductors can also be removed.

The above object of the present invention has also been achieved by providing (2) a method for producing a ceramic substrate, comprising a substrate fabrication step of fabricating a green ceramic substrate comprising a laminate of first ceramic green sheets and conductor layers, and surface conductors formed on a main surface of the laminate; a covering step of applying a ceramic paste to a surface of the green ceramic substrate on which surface conductors are formed to thereby form a paste coating layer and then laminating a second ceramic green sheet on the formed paste coating layer so as to cover the surface conductors and the main surface of the laminate with a green ceramic covering layer including the paste coating layer and the second ceramic green sheet, the ceramic paste subsequently being integrated with the green ceramic substrate by cofiring and the second ceramic green sheet subsequently being integrated with the paste coating layer by cofiring; a restraining step of laminating a restraint sheet on each of opposite sides of the green ceramic substrate covered with the second ceramic green sheet, so as to restrain the green ceramic substrate together with the green ceramic covering layer, the restraint sheets containing a predominant amount of a sintering-resistant inorganic material, which is not sintered at a sintering temperature at which the green ceramic substrate is sintered; a firing step of firing the green ceramic covering layer and the green ceramic substrate under restraint at a temperature at which the green ceramic covering layer and the green ceramic substrate are integrally sintered, whereas the restraint sheets are not sintered, to thereby yield a ceramic substrate restrained by means of the restraint sheets; and a removing step of removing, from the ceramic substrate restrained by means of the restraint sheets, the restraint sheets and a ceramic covering layer which is an upper portion of a ceramic layer formed from the green ceramic covering layer and which covers the surface conductors, to thereby expose the surface conductors.

According to the above method (2) of the present invention, the green ceramic substrate on which the paste coating layer and the second ceramic green sheet are laminated is fired while being sandwiched between the restraint sheets. Thus, firing shrinkage in an XY-plane direction (in a plane) is restrained, and firing shrinkage in the Z direction (in the thickness direction) becomes predominant, thereby reducing firing strain (warpage). Since the green ceramic covering layer formed by the paste coating layer and the second ceramic green sheet intervenes between the surface conductors and the restraint sheet, surface roughness of the restraint sheet is not transferred onto the surface conductors. The green ceramic covering layer fills a region of the main surface of the green ceramic substrate (also called the "substrate body") where the surface conductors are absent. This allows, during the sintering process, a restraining force to be exerted uniformly in a plane. Accordingly, firing strain occurring in a plane becomes more uniform, whereby an overall firing strain can be further reduced. As a result of cofiring, the green ceramic covering layer is integrated with the substrate body. Thus, after firing, a ceramic covering layer that covers the surface conductors must be removed together with the restraint sheets. In the removing step, foreign matter (specifically, ceramic particles and the like) adhering to the surface conductors can also be removed.

In the method (2) of the present invention, the paste coating layer is formed, and subsequently a second ceramic green sheet is laminated thereon. With this procedure, the coating amount of the ceramic paste having fluidity can be made relatively small. Therefore, expansion of surface conductors which may otherwise be caused due to permeation of the solvent contained in the paste into the conductors can be minimized, contributing to the maintenance of fine patterns in good condition.

The above object of the present invention has also been achieved by providing (3) a method for producing a ceramic substrate comprising a substrate fabrication step of fabricating a green ceramic substrate comprising a laminate of first ceramic green sheets and conductor layers, and surface conductors formed on a main surface of the laminate; a covering step of laminating a second ceramic green sheet on the green ceramic substrate so as to cover the surface conductors and the main surface of the laminate, the second ceramic green sheet subsequently being integrated with the first ceramic green sheets by cofiring; a restraining step of laminating a restraint sheet on each of opposite sides of the green ceramic substrate covered with the second ceramic green sheet, so as to restrain the green ceramic substrate together with the second ceramic green sheet, the restraint sheets containing a predominant amount of a sintering-resistant inorganic material, which is not sintered at a sintering temperature at which the green ceramic substrate is sintered; a firing step of firing the second ceramic green sheet and the green ceramic substrate under restraint at a temperature at which the second ceramic green sheet and the green ceramic substrate are integrally sintered, whereas the restraint sheets are not sintered, to thereby yield a ceramic substrate restrained by means of the restraint sheets; and a removing step of removing, from the ceramic sheet restrained by means of the restraint sheets, the restraint sheets and a ceramic covering layer which is an upper portion of a ceramic layer formed from the second ceramic green sheet and which covers the surface conductors, to thereby expose the surface conductors.

According to the above method (3) of the present invention, the green ceramic substrate and the second ceramic green sheet, which is laminated on the green ceramic substrate, are fired while being sandwiched between the restraint sheets. Thus, firing shrinkage in an XY-plane direction (in a plane) is restrained, and firing shrinkage in the Z direction (in the thickness direction) becomes predominant, thereby reducing firing strain (warpage). Since the second ceramic green sheet intervenes between the surface conductors and the restraint sheet, surface roughness of the restraint sheet is not transferred onto the surface conductors. The second ceramic green sheet fills a region of the main surface of the green ceramic substrate (also called the "substrate body") where the surface conductors are absent. This allows, during the sintering process, a restraining force to be exerted uniformly in a plane. Accordingly, firing strain occurring in a plane becomes more uniform, whereby an overall firing strain can be further reduced. As a result of cofiring, the second ceramic green sheet is integrated with the substrate body. Thus, after firing, a ceramic covering layer that covers the surface conductors must be removed together with the restraint sheets. In the removing step, foreign matter (specifically, ceramic particles and the like) adhering to the surface conductors can also be removed.

In methods (1), (2) and (3) of the present invention for producing a ceramic substrate which employs a cofiring process using restraint sheets, firing strain can be minimized while transfer of unfavorable surface roughness onto the surface conductors, adhesion of foreign matter to the surface conductors, and deterioration in plating property and solder wettability of the surface conductors are prevented.

The above ceramic paste may conveniently be prepared from an inorganic material having substantially the same composition as that of the ceramic green sheets forming the green ceramic substrate and an organic material serving as a solvent and a binder. This brings about coincidence in firing temperature; i.e., firing timing, between the ceramic paste coating layer formed from the ceramic paste by means of coating and the green ceramic substrate, whereby the ceramic paste coating layer and the green ceramic substrate can be integrated together readily and reliably. The term "substantially the same" includes mixing-in of unavoidable impurities.

Preferably, in the covering step, the side of the green ceramic substrate on which a surface conductor layer is formed is flattened by means of pressing, and subsequently the ceramic paste is applied to the flattened side at a thickness of 1 μm to 50 μm. When the thickness of the ceramic paste is less than 1 μm, a restraining force fails to be exerted uniformly in a plane. When the thickness of the ceramic paste is in excess of 50 μm, a thick ceramic covering layer is formed on the surface conductors through firing. Removal of such a thick ceramic covering layer is difficult, or time consumed by the removing step increases significantly. As a result, productivity may be sacrificed.

The inorganic material used to form the second ceramic green sheet and an inorganic material used to form the first ceramic green sheets can conveniently have substantially the same composition. This brings about coincidence in firing temperature; i.e., firing timing, between the first ceramic green sheets and the second ceramic green sheet. Therefore, the ceramic paste coating layer formed from the ceramic paste by means of coating, the second ceramic green sheets, and the green ceramic substrate can be integrated together readily and reliably.

The method for producing a ceramic substrate may further comprise a step of forming conductive bumps on the corresponding surface conductors exposed by the removing step. The method for producing a ceramic substrate may further comprise a plating step of forming a plating layer on each of the surface conductors exposed by the removing step. The surface conductors flush with a ceramic dielectric layer are raised in level by means of plating, whereby dense level-raised metal terminals can be formed. The level-raised metal terminals have the following advantages. For example, in the case where the ceramic substrate is to be mounted on an organic package or the like, an under-fill material formed of a resin material or the like may be filled in a gap between the ceramic substrate and the organic package in order to alleviate the influence of difference in thermal expansion therebetween. In this case, if the ceramic substrate has level-raised metal terminals, a relatively large gap can be formed between the ceramic substrate and the organic package, so that the under-fill material can be filled in the gap in a good condition. Also, a wide choice in the kinds of under-fill material is provided.

In the case where the ceramic substrate to be produced is an assembly of ceramic components (a multi-ceramic-component substrate) to be divided into a plurality of ceramic components (such as ceramic capacitors), the production method of the present invention is particularly effective in avoiding warpage of the ceramic substrate, which would otherwise become severe.

The above object of the present invention has also been achieved by providing a ceramic substrate comprising a laminate of ceramic dielectric layers and conductor layers; metal terminals exposed on a surface of the laminate adapted as external connections; and via conductors extending through the ceramic dielectric layers in their thickness direction. Each of the metal terminals has a diameter equal to or greater than that of the via conductors and comprises a base metal layer and a plating layer. The base metal layer is concentrically in contact with the corresponding via conductor to thereby electrically connect to the internal conductor layers, and the plating layer is in direct contact with the base metal layer. Only the plating layer is exposed at a main surface of the ceramic substrate, while the base metal layer is embedded in the ceramic dielectric layer whose surface serves as the main surface, such that a boundary between the plating layer and the base metal layer is substantially flush with the main surface of the ceramic dielectric layer. An example of the substrate includes a ceramic capacitor.

DESCRIPTION OF REFERENCE NUMERALS

Figure 1:
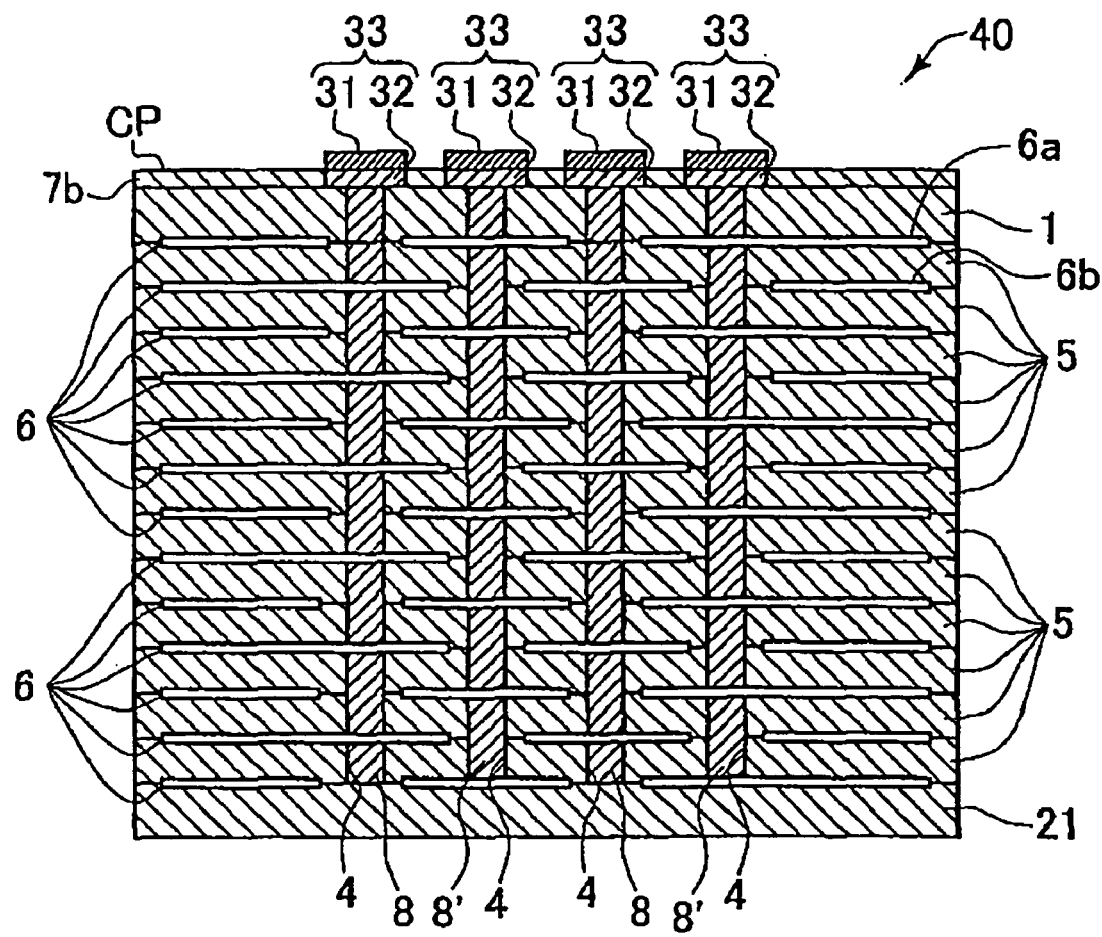
FIG. 1 is a schematic sectional view of a laminated ceramic capacitor.

Reference numerals used to describe various structural elements in the drawings include the following.

1, 5, 21: ceramic dielectric layer (first ceramic green sheet)
6: conductor pattern layer (conductor layer)
7: ceramic green covering layer (second ceramic green sheet)
7a: ceramic covering layer
7b: ceramic dielectric layer
8, 8': via electrode (via conductor)
30': laminate
30: green ceramic substrate
31: plating layer
32: surface conductor (base metal layer)
33: metal terminal
40: capacitor (ceramic substrate)
85: multi-ceramic-component substrate

DESCRIPTION OF THE PREFERRED EMBODIMENTS

An embodiment of the present invention will next be described with reference to the accompanying drawings. However, the present invention should not be construed as being limited thereto.

FIG. 1 shows a sectional structure of a surface-mount-type laminated ceramic capacitor 40 (hereinafter also referred to as the "capacitor 40"), which is an embodiment of a ceramic substrate of the present invention. The capacitor 40 is a laminate of ceramic dielectric layers 5 and wiring pattern layers 6, which are alternately arranged in layers. The wiring pattern layers 6 that face each other with the ceramic dielectric layers 5 sandwiched therebetween are electrically connected by means of a via electrode 8 or 8', which extends through the ceramic dielectric layers 5. Each of the wiring pattern layers 6 includes a first capacitor electrode 6a and a second capacitor electrode 6b, which face each other with the corresponding ceramic dielectric layer 5 sandwiched therebetween. The via electrodes 8 and 8' include first via electrodes 8, which are electrically connected to the first capacitor electrodes 6a and are not electrically connected to the second capacitor electrodes 6b, and second via electrodes 8', which are electrically connected to the second capacitor electrodes 6b and are not electrically connected to the first capacitor electrodes 6a. A metal terminal 33 for flip-chip connection is formed on each of the first and second via electrodes 8 and 8' at one side of the capacitor 40.

As shown in FIG. 1, the metal terminals 33 have a diameter greater than that of the via electrodes 8 and 8'. Each of the metal terminals 33 is composed of a surface conductor 32 and a plating layer 31. The surface conductors 32 are located concentrically on the corresponding via electrodes 8 and 8' and are electrically connected to the internal conductor pattern layers 6. The plating layer 31 is provided on each of the surface conductors 32. The surface conductors 32 are embedded in a ceramic dielectric layer 7b whose surface serves as a main surface CP of the capacitor 40. The boundary between the plating player 31 and each of the surface conductors 32 is substantially flush with the main surface CP of the ceramic dielectric layer 7b, so that the plating layer 31 projects from the main surface CP. The plating layer 31 is composed of a plating layer, which is formed of the same metal (e.g., Cu or Ag) as that used to form the surface conductors 32, and an Ni/Au plating layer, which is formed on the plating layer. The height of the plating layer 31 is adjusted to, for example, 1 mm to 100 mm above the main surface CP of the ceramic dielectric layer 7b. Each of the surface conductors 32 serves as a base metal for the plating layer 31 and is formed of the same metal as that used to form the wiring pattern layers 6 and the via conductors 8 and 8'. Solder bumps (not shown) may be formed on the plating layer 31 by use of an Sn—Pb eutectic solder or a solder that does not contain Pb, such as a Sn—Ag—Cu solder or a Sn—Ag solder. Alternatively, solder bumps may be formed directly on the corresponding surface conductors 32 by means of plating or the like.

A process for producing the capacitor 40 will next be described.

The capacitor 40 is produced using a ceramic green sheet. The ceramic green sheet can be produced by a doctor blade method described below. First, a dielectric ceramic powder serving as a material ceramic powder (for example, in the case of a glass ceramic powder, a mixture of a borosilicate glass powder and a ceramic filler powder, such as BaTiO$_3$; average particle diameter: about 0.3 mm to about 1 mm) and one or more additives are mixed together and kneaded, thereby yielding a slurry. Examples of the additives include solvents (e.g., acetone, methyl ethyl ketone, diacetone, methyl isobutyl ketone, benzene, bromochloromethane, ethanol, butanol, propanol, toluene, xylene), binders (e.g., acrylic resin (e.g., polyacrylate or polymethyl methacrylate), cellulose acetate butyrate, polyethylene, polyvinyl alcohol, polyvinyl butyral), plasticizers (e.g., butyl benzyl phthalate, dibutyl phthalate, dimethyl phthalate, phthalic acid ester, polyethylene glycol derivative, tricresol phosphate), deflocculants (e.g., fatty acid (e.g., glycerin trioleate), surfactants (e.g., benzenesulfonic acid), and humectants (alkylarylpolyether alcohol, polyethylene glycol ethyl ether, nitylphenyl glycol, polyoxyethylene ester).

Next, a metallized paste for use in forming via electrodes (hereinafter also referred to as a "via electrode paste") is prepared. A metal powder component of the metallized paste may be, for example, Ag, AgPt, AgPd, Au, Ni, or Cu, and having an average particle size of 2 mm to 20 mm. An organic solvent, such as butyl carbitol, is added to the metal powder so as to obtain appropriate viscosity, thereby yielding a via electrode paste. A metallized paste to be used in forming wiring pattern layers (hereinafter referred to as a "wiring pattern layer paste") is prepared. The metal powder for use in preparing the metallized paste can comprise the same metal used in preparing the via electrode paste and has an average particle size regulated to fall within a range of 0.1 µm to 3 µm. An inorganic compound powder having an average particle size of 500 nm or less (preferably 100 nm or less, more preferably 50 nm or less) is added to the metal powder in an amount of 0.5 wt. % to 30 wt. %. An organic binder, such as ethyl cellulose, and an organic solvent, such as butyl carbitol, are added to the resultant mixture so as to obtain appropriate viscosity, thereby yielding a metallized paste for use in forming the wiring pattern layers. Notably, the material ceramic powder used to form the ceramic green sheet may be used as the above-mentioned inorganic compound powder. Alternatively, an inorganic compound powder (having an average particle size of 100 nm or less, preferably 50 nm or less) comprising at least one of aluminum oxide ($Al_2O_3$), silicon dioxide ($SiO_2$), and titanium oxide ($TiO_2$) may be used as the above-mentioned inorganic compound powder.

Figure 3A:
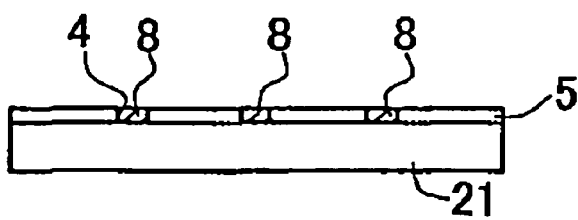
FIGS. 3(a) to 3(d) are explanatory views illustrating a process of fabricating a green ceramic substrate.

By use of the above-prepared ceramic green sheet and metallized pastes, a green ceramic substrate is fabricated as follows. In order to facilitate understanding of the following description, reference numerals and names of components of the capacitor 40 obtained through firing are used to refer to counterparts before firing. First, as shown in FIG. 3(a), a ceramic green sheet 21 to be used in forming a second base portion is prepared. A plurality of ceramic green sheets 5 to be laminated are prepared. The ceramic green sheets 5 are thinner than the ceramic green sheets 21. A plurality of via holes 4 are formed in the ceramic green sheets 5 at identical positions. The via electrode paste fills the via holes 4 to thereby form via electrodes 8. The first and second capacitor electrodes 6a and 6b, which serve as the wiring pattern layers 6, are formed by printing on one side of each of the ceramic green sheets 5 using the wiring pattern layer paste so as to be electrically connected to the corresponding via electrodes 8.

Figure 3B:
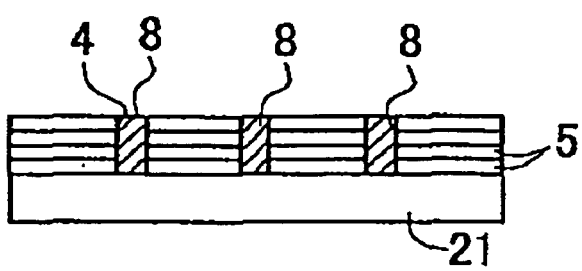
Figure 3C:
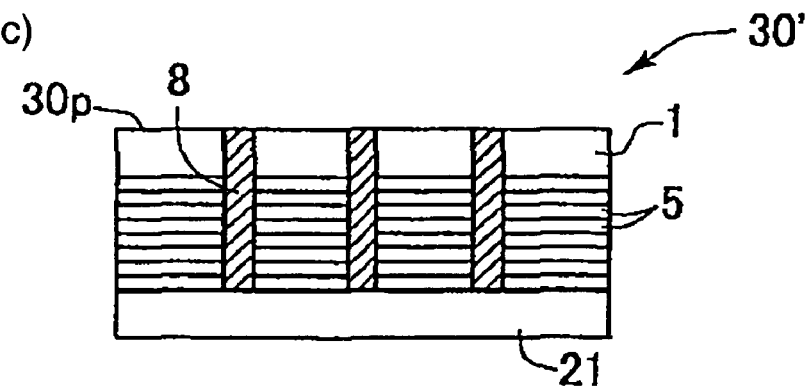
Figure 3D:
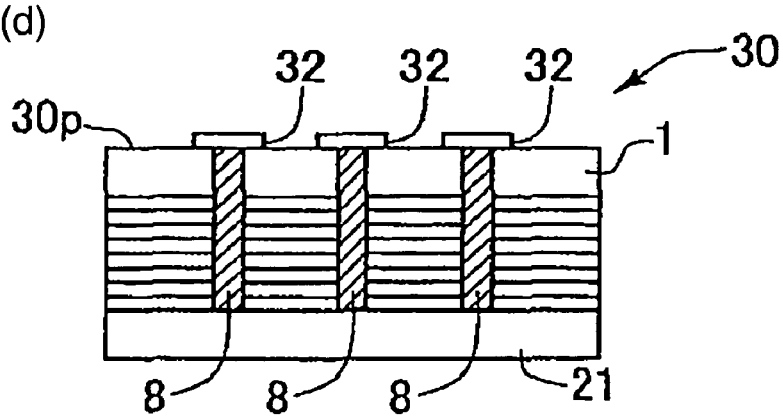

Next, as shown in FIG. 3(b), the ceramic green sheets 5 are successively laminated on the ceramic green sheet 21 used in forming the second base portion. As shown in FIG. 3(c), a ceramic green sheet 1, in which the via electrodes 8 are similarly formed in the corresponding via holes 4 and which is used to form a first base portion, is overlaid on and press-bonded to the laminate, thereby yielding a laminate 30' consisting of a predetermined number N of ceramic green sheets 5 and a predetermined number of wiring pattern layers, which are arranged alternately in layers (plus the ceramic green sheets 1 and 21 used to form the corresponding base portions). The surface conductors 32 are formed by printing on a main surface 30p of the laminate 30' using the metallized paste, thereby yielding a green ceramic substrate 30 (see FIG. 3(d)).

Figure 4:
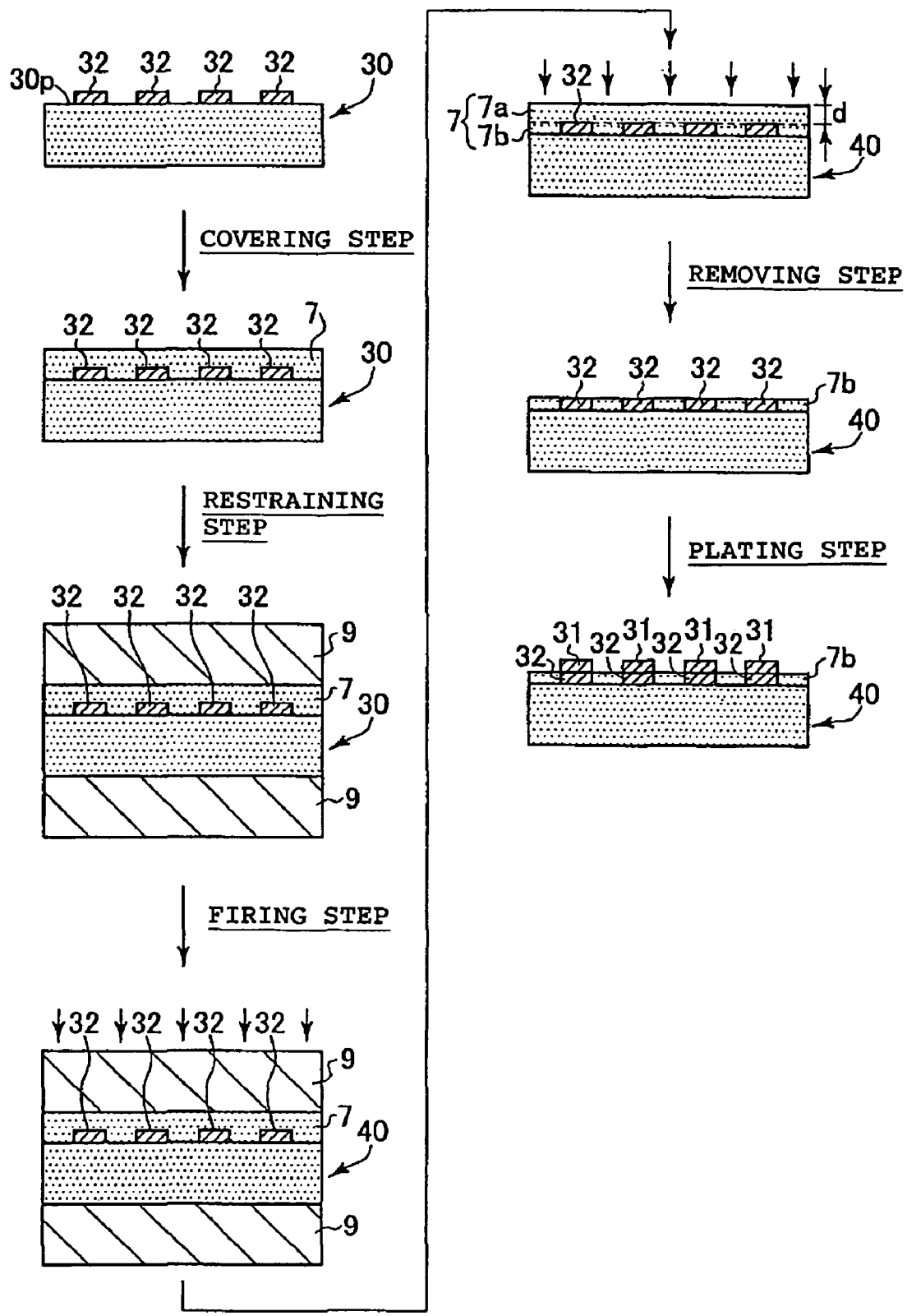
FIG. 4 illustrates a firing process using restraint sheets.

Next, as shown in FIG. 4, a ceramic green covering layer 7 is formed on the side of the green ceramic substrate 30 where the surface conductors 32 are formed (covering step in FIG. 4). The ceramic green covering layer 7 is to be integrated with the green ceramic substrate 30 (specifically, the surface conductors 32 and the ceramic green sheet 1) by cofiring. In order to enhance adhesion of the ceramic green covering layer 7 to the side of the green ceramic substrate 30 where the surface conductors 32 are formed, the side may be flattened beforehand by pressing. Several methods are available for forming the ceramic green covering layer 7.

Figure 5:
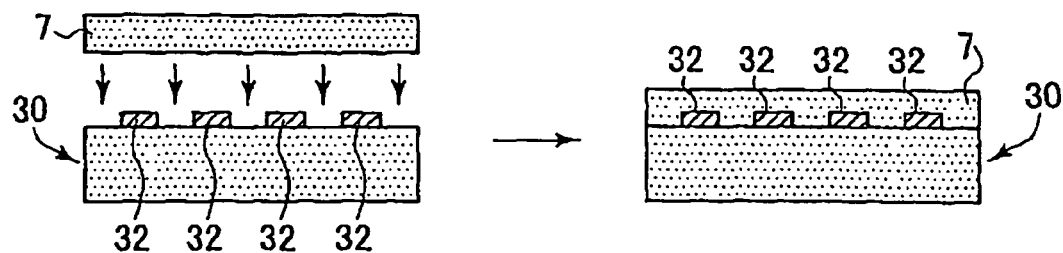
FIG. 5 illustrates a ceramic green covering layer.

First, FIG. 5 shows a lamination and press-bonding method. A second ceramic green sheet 7, which is formed beforehand separately from the green ceramic substrate 30, is laminated on and press-bonded to the green ceramic substrate 30. The sheet lamination method is convenient in view of its relatively simple procedure. The second ceramic green sheet 7 may be formed to have substantially the same composition as that of the ceramic green sheets 1, 5, and 21, which are used to form the green ceramic substrate 30; i.e., the second ceramic green sheet 7 may be formed by use of the same slurry as that used to form the ceramic green sheets 1, 5, and 21. When the ceramic green sheet is formed in this manner, the greatest cost reduction can be expected. However, so long as firing timing falls within substantially the same range, the second ceramic green sheet 7 and the ceramic green sheets 1, 5, and 21 can differ in composition, with the same inorganic material being used. Alternatively, the second ceramic green sheet 7 may be formed from a material different from that used to form the ceramic green sheets 1, 5, and 21. For example, in the case where the ceramic dielectric layer 7b formed from the second ceramic green sheet 7 is to function as a circuit element, its dielectric constant must be appropriately adjusted.

Preferably, the second ceramic green sheet 7 is formed to a thickness of 1 mm to 50 mm. When the thickness of the second ceramic green sheet 7 is less than 1 mm, a restraining force fails to be exerted uniformly in a plane. When the thickness of the second ceramic green sheet 7 is in excess of 50 mm, a thick ceramic covering layer 7a is formed on the surface conductors 32 through firing. Removal of such a thick ceramic covering layer 7a is difficult, or the time consumed by the removing step increases significantly. As a result, productivity may be sacrificed significantly. The second ceramic green sheet 7 can be formed by a known doctor blade process.

Figure 6:
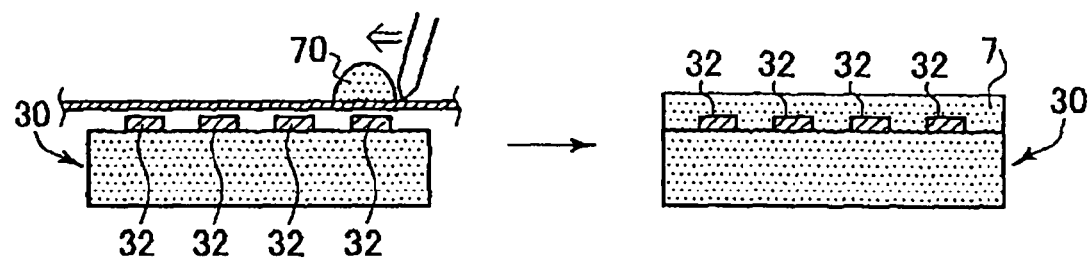
FIG. 6 illustrates a ceramic green covering layer.

Another method is shown in FIG. 6. FIG. 6 depicts a printing method such as a screen-printing method. A ceramic paste 70 is applied by printing to a thickness so as to thinly cover the surface conductors 32. When this method is applied to the case where a plurality of surface conductors 32, which serve as the metal terminals 33, are formed in an array, the ceramic paste 70 readily fills a space between the adjacent surface conductors 32, so that the ceramic green covering layer 7 can be formed to have a low surface roughness. As a result, a restraining force of a restraint sheet 9, described below, is exerted uniformly in a plane, so that firing strain can be sufficiently reduced. A useful material for the ceramic paste 70 can be prepared by mixing an inorganic material having the same composition as that of the second ceramic green sheet 7 shown in FIG. 5 and organic materials, such as a solvent and a binder. In order to facilitate printing, the organic materials, such as an organic solvent, and the mixing ratio between the organic materials and the inorganic material can differ from those of the slurry used to form the green sheets. In order to appropriately remove an organic solvent and the like from the ceramic paste 70, after completing the step of applying the ceramic paste 70 by printing, the green ceramic substrate 30 may be dried in a drying furnace.

Figure 7:
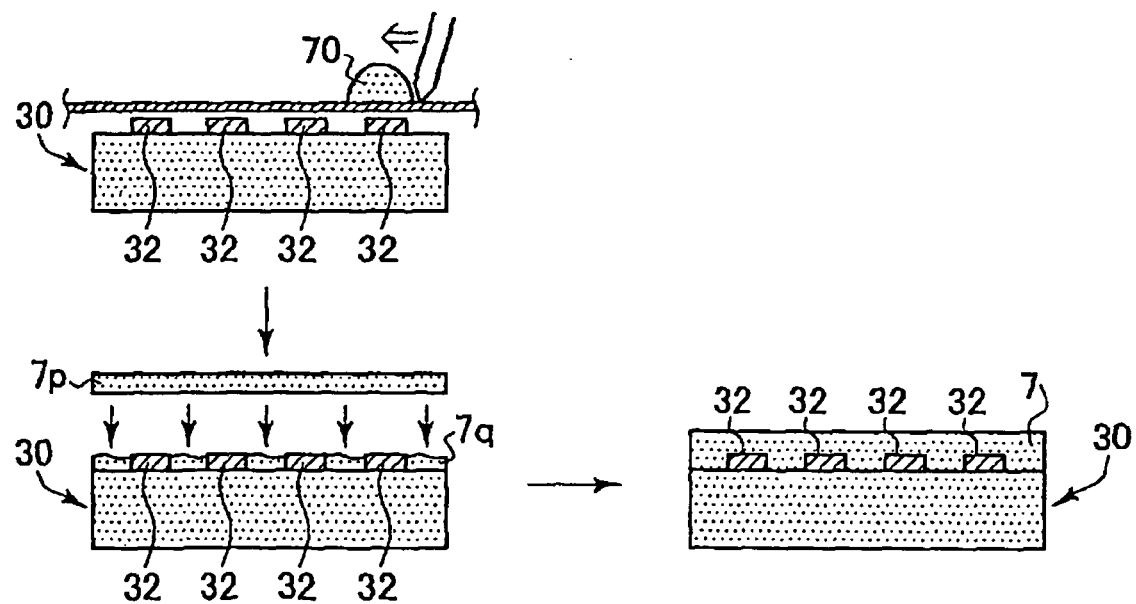
FIG. 7 illustrates another process of forming a ceramic green covering layer.

FIG. 7 shows yet another method; i.e., a combination of the method of FIG. 5 and the method of FIG. 6. The above-mentioned ceramic paste 70 is thinly applied by printing, and subsequently a separately prepared second ceramic green sheet 7p is laminated and press-bonded. The method of FIG. 6, in which the paste is applied by printing, potentially involves the following problem: the surface conductors 32 are impregnated with an organic solvent or the like contained in the ceramic paste 70 and are consequently swollen to thereby have a dulled shape. By contrast, the method in which the previously formed green sheet is laminated does have the problem of swelling of the surface conductors 32, but is inferior to the method of FIG. 6 in terms of adhesion.

Thus, as shown in FIG. 7, first the ceramic paste 70 is applied by printing to a thickness so not to exceed the height of the surface conductors 32, to thereby form a paste coating layer 7q. Subsequently, the previously prepared second ceramic green sheet 7p is laminated and press-bonded to thereby form the ceramic green covering layer 7. The ceramic paste 70 may be applied by printing over the entire surface of the green ceramic substrate 30 or may be selectively applied, by pattern printing, to a region of the surface of the green ceramic substrate 30 where the surface conductors 32 are absent. According to the method of FIG. 7, the application amount of the fluidal ceramic paste 70 is relatively small, and bonding of the second ceramic green sheet 7p is employed. As a result, the surface conductors 32 are unlikely to suffer swelling, which could otherwise result from impregnation of an organic solvent thereinto. Notably, a drying step may be carried out between the two steps (the step of applying the paste by printing and the step of bonding the sheet).

Referring back to FIG. 4, the restraint sheets 9 are laminated on the corresponding opposite sides of the green ceramic substrate 30. The restraint sheets 9 contain a predominant amount of a sintering-resistant inorganic material, which is not sintered at a sintering temperature at which the green ceramic substrate 30 is sintered. The restraint sheets 9 restrain the green ceramic substrate 30 together with the ceramic green covering layer 7 (restraining step in FIG. 4). In the case of the present embodiment in which the ceramic substrate is of a low-temperature-fired ceramic (glass ceramic), the restraint sheets 9 can be, for example, ceramic green sheets 9 that contain a predominant amount of a sintering-resistant inorganic material comprising one or more of $Al_2O_3$, $ZrO_2$, and BN. In other words, the restraint sheets 9 can be of a material that has a composition so as not to be sintered at a sintering temperature at which the green ceramic substrate 30 is sintered. Notably, the expression "to contain a predominant amount of" or "to be contained predominantly" means that, among all ingredients, an ingredient in question is contained in the largest amount in % by mass.

Next, the restrained green ceramic substrate 30 is fired at a temperature at which the ceramic green covering layer 7 and the green ceramic substrate 30 are integrally sintered and at which the restraint sheets 9 are not sintered, thereby yielding a restrained ceramic substrate 40 (firing step in FIG. 4). The ceramic substrate 40 has a ceramic layer 7 formed from the ceramic green covering layer 7. The ceramic layer 7 consists of the ceramic covering layer 7a, which covers the surface conductors 32, and the ceramic dielectric layer 7b, which occupies a space between the adjacent surface conductors 32. The above-mentioned firing temperature can range from 800° C. to 1,000° C. (the temperature can be, for example, 950° C.), which temperature range is commonly employed in forming a low-temperature-fired ceramic. Firing can be performed in atmosphere having a pressure higher than atmospheric pressure or while pressure is applied mechanically to the restraint sheets 9. In the case where the ceramic substrate 40 is formed mainly of alumina, whereas the restraint sheets 9 are formed of BN or the like, the above-mentioned firing temperature can range from 1,200° C. to 1,900° C.

Next, the restraint sheets 9 and the ceramic covering layer 7a, which covers the surface conductors 32, are removed from the ceramic substrate 40 by wet sandblasting or polishing, to thereby expose the surface conductors 32 (removing step in FIG. 4). Since the restraint sheets 9 and the ceramic covering layer 7a differ in ease of removal, different methods may be used for their removal. Specifically, the restraint sheets 9 are removed by wet sandblasting, whereas the ceramic covering layer 7a is removed by mechanical polishing or chemical etching, or a combined process thereof. The ceramic covering layer 7a, which is located on the surface conductors 32, and the ceramic dielectric layer 7b, which is formed to the same height (thickness) as that of the surface conductors 32, are both formed from the ceramic green covering layer 7 which undergoes firing. The surface conductors 32 and the ceramic covering layer 7a are integrated with each other. However, when the ceramic covering layer 7a has a thickness d which is sufficiently small (e.g., 50 μm or less thick), the ceramic covering layer 7a can be removed relatively easily, and foreign matter hardly remains.

After the ceramic covering layer 7a, which covers the surface conductors 32, is removed, a plating layer 31 is formed on the exposed surface conductors 32 (plating step in FIG. 4). Specifically, an electrically conductive, primary plating layer is formed on the ceramic substrate 40 by electroless plating, and then resist is applied onto the primary plating layer. The resist is patterned so as to expose the surface conductors 32. Subsequently, the plating layer 31 is formed on the surface conductors 32 by electroplating. The resist and the primary plating layer are removed, thereby yielding the ceramic substrate 40 that has the plating layer 31 and serves as a surface-mount-type capacitor. This plating step can be performed using the same metal as that of the surface conductors 32 (e.g., Cu). Preferably, after the height of the plating layer 31 is sufficiently increased, an electroless Ni/Au plating layer is formed. This allows formation of highly level-raised terminals. As a result, in the case where the ceramic substrate 40 (capacitor 40) is mounted on an organic package or the like, a large gap can be formed therebetween, thereby facilitating filling of an under-fill material into the gap.

In the case where the surface conductors 32 are raised in level by means of the plating layer 31, and then the Ni/Au plating layer is formed on the plating layer 31, the Ni/Au plating layer is formed on a plating metal layer that has few pits or is in a like condition. Thus, the formed Ni/Au plating layer becomes denser, thereby contributing to an improvement in solder wettability of the metal terminals 33. Notably, electroless Ni/Au plating may be directly performed on the surface conductors 32. This is advantageous in terms of production cost, because a resist patterning step and the like can be omitted. Alternatively, solder bumps can be formed directly on the corresponding surface conductors 32.

Figure 2:
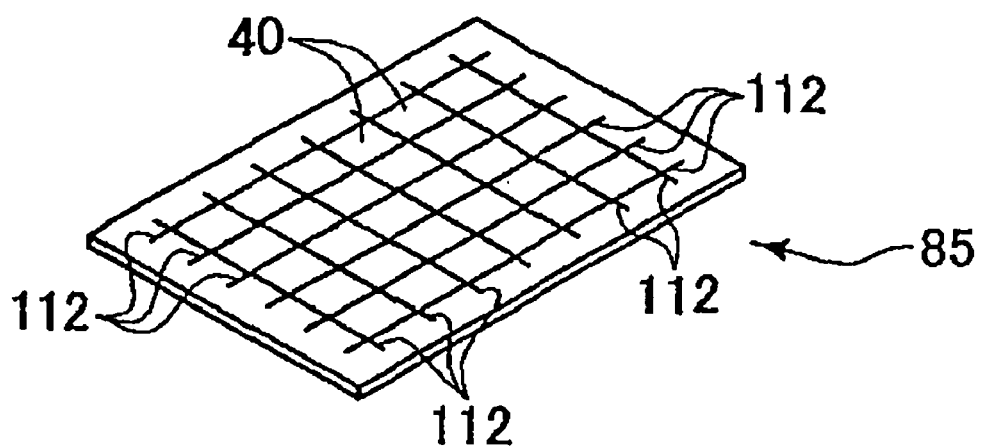
FIG. 2 is a schematic view of a multi-ceramic-component substrate.

Ceramic electronic circuit components, such as the capacitors 40 of the present embodiment, are generally produced in the form of a multi-ceramic-component substrate 85 shown in FIG. 2. The multi-ceramic-component substrate 85 is divided along dividing grooves 112 into the individual components (capacitors) 40. In the case where a ceramic substrate to be produced is the multi-ceramic-component substrate 85, which is divided into a plurality of components, the production method of the present invention is particularly effective in avoiding a problem of warpage of the ceramic substrate, which would otherwise become severe.

The present embodiment is described in reference to a ceramic substrate in which metal terminals are formed only on one main surface. However, the present invention can also be applied to production of a ceramic substrate in which surface conductors, such as metal terminals, are formed on both sides, as in the case of an IC package. The present embodiment is described in reference to surface conductors 32 that serve as metal terminals. However, the method of the present invention can be advantageously applied to the case where surface conductors serve as circuit patterns.

EXAMPLES (1) Preparation of Glass Powders

A material powder was prepared by mixing a $SiO_2$ powder, a $B_2O_3$ powder, an $Al_2O_3$ powder, a CaO powder, a ZnO powder, an $Na_2CO_3$ powder, a $K_2CO_3$ powder, etc., as well as an MgO powder, a BaO powder, an SrO powder, and a ZrO powder in the proportions shown in Table 1. The thus-obtained material powder was melted by application of heat. The resultant molten material was quenched in water and granulated therein, thereby yielding a glass frit. The glass frit was further pulverized in a ball mill, thereby obtaining seven kinds of glass powders having an average particle size of 3 mm (glass No. 1 to No. 7).

TABLE 1

| | Dielectric porcelain | | | | | | | | | | Inorganic filler |
|---|---|---|---|---|---|---|---|---|---|---|---|
| | Glass | | | | | | | | | | |
| | Composition (mass %) | | | | | | | | | | |
| Glass | | | | | | Alkali | Others | | | | Alumina |
| No. | $SiO_2$ | $B_2O_3$ | $Al_2O_3$ | CaO | ZnO | metal | MgO | BaO | SrO | $ZrO_2$ | (mass %) | (mass %) |
| 1 | 20 | 26 | 25 | 17 | 12 | — | | — | | | 50 | 50 |
| 2 | 22 | 21 | 26 | 18 | 13 | — | | — | | | | |
| 3 | 25 | 21 | 25 | 17 | 12 | — | | — | | | | |
| 4 | 35 | 8.6 | 19 | 17 | — | 0.3 $K_2O$ | 0.4 | 19 | 0.7 | — | | |
| 5 | 22 | 22 | 8 | — | 48 | — | | — | | | | |
| 6 | 39 | 7.5 | 22 | 19 | 11 | 1.4 $Na_2O$ | 0.1 | | — | | | |
| 7 | 43 | 8 | 28 | 8 | — | — | 12 | | — | 1 | | |

(2) Formation of Ceramic Green Sheets

Each of the above-obtained seven kinds of glass powders and an inorganic filler powder; specifically, an alumina powder, were measured out in an amount of 50% by mass each as shown in Table 1 and were mixed in a ball mill, whereby seven kinds of mixed powders were obtained. Binder (acrylic resin), plasticizer [dibutyl phthalate (DBP)], and solvent (toluene) were added to each of the mixed powders. Each of the resultant mixtures was kneaded, whereby seven kinds of slurries were prepared. Each of the obtained slurries was formed, by a doctor blade method, into a sheet having a thickness of 100 mm as measured after firing, whereby seven kinds of ceramic green sheets were obtained. A thin ceramic green sheet having a thickness of 1 μm to 50 μm was formed as follows: a slurry was applied through printing onto a PET resin tape by use of a commercially available roll coater.

(3) Formation of a Ceramic Green Sheet for Restraint Use

An alumina powder (average particle size: 3 μm) was used as a sintering-resistant inorganic material that was not sintered at a temperature at which a green ceramic substrate was fired. The alumina powder was formed into a sheet having a thickness of 500 μm by a method similar to that for forming the above ceramic green sheets.

(4) Formation of Dielectric Porcelain for Thermal Expansion Coefficient and Warpage Measurement Dielectric porcelain pieces (100 mm×100 mm) were formed by a conventional method without the use of restraint sheets. Specifically, sheet pieces having a predetermined shape were blanked out from each of the above-mentioned seven kinds of ceramic green sheets. For each of the seven kinds of ceramic green sheets, the thus-obtained 20 sheet pieces were laminated and were thermally press-bonded. The thus-obtained seven kinds of laminates were fired for 15 minutes at 900° C., thereby obtaining the seven kinds of porcelain pieces. Each of the porcelain pieces was formed into prismatic pieces, each measuring 3 mm×3 mm×1.6 mm (height), by means of polishing, whereby seven kinds of second porcelain pieces to be measured were obtained. The temperature of the second porcelain pieces to be measured was increased from 25° C. to 400° C. for thermal expansion coefficient measurement using a differential-dilatometry-type thermomechanical analyzer (Model TMA8140C, a product of Rigaku Corporation). The measurement results are shown in Table 2.

TABLE 2

Characteristics of dielectric porcelain

| Glass No. | Dielectric loss (×10$^{-4}$) (3 GHz) | $\epsilon_r$ (3 GHz) | Thermal expansion coefficient (25° C. to 400° C.) (ppm/° C.) | Warpage (μm) |
|---|---|---|---|---|
| 1 | 39 | 7.5 | 5.4 | 300 |
| 2 | 30 | 7.6 | 5.4 | 320 |
| 3 | 30 | 7.6 | 5.3 | 310 |
| 4 | 18 | 5.6 | 5.5 | 650 |
| 5 | 63 | 6.5 | 6.4 | 1,000 |
| 6 | 19 | 6.6 | 4.9 | 760 |
| 7 | 40 | 7.2 | 5.4 | 680 |

(5) Formation of Dielectric Porcelain for Measurement and Evaluation of Cofiring Property Next, dielectric porcelain pieces were formed using restraint sheets. An Ag paste was applied to each of the above-mentioned seven kinds of ceramic green sheets at a predetermined position by a screen-printing process such that the thickness of the applied Ag paste was 15 μm. The thus-prepared five ceramic green sheets of each kind were successively laminated by means of thermal press-bonding, thereby obtaining a green ceramic substrate of each kind in which a predetermined, printed pattern formed from Ag paste is sandwiched between the ceramic green sheets. Then, the Ag paste was applied to each of the thus-obtained green ceramic substrates at a predetermined position on opposite sides by a screen-printing process such that the thickness of the applied Ag paste was 20 μm. Notably, as shown in Table 3, some green ceramic substrates were subjected to a pressing step for flattening the surface wiring layers. Second ceramic green sheets (surface-layer-covering sheets), which had a thickness shown in Table 4 and which contained the same dielectric material as that contained in the above-mentioned seven kinds of ceramic green sheets, were laminated on corresponding opposite sides of each of the green ceramic substrates, thereby obtaining green ceramic substrates whose surface conductors were covered. Circular marks in Ag paste each having a diameter of 100 μm were screen-printed on each of the resultant green ceramic substrates at predetermined positions so as to be latticed at intervals of 3 cm. The printed circular marks were used to measure the firing shrinkage percentage in a planar direction (horizontal directions) before and after firing. The alumina restraint sheets prepared above (4) above were laminated on each of the green ceramic substrates whose surface conductors were covered, thereby obtaining restrained green ceramic substrates. The restrained green ceramic substrates were passed through a mesh belt furnace set to a temperature of 900° C., to thereby obtain fired, restrained ceramic substrates. The restraint sheets and the ceramic covering layers that covered the surface conductors were removed by wet sandblasting, whereby the surface conductors were exposed to thereby yield target ceramic substrates.

(6) Evaluation of Warpage Caused by Firing

The above-obtained porcelain pieces were placed on a plane and the difference between the highest position and the lowest position (position of contact with the plane) was determined as measured from the plane. The measurement results are shown in Tables 3, 4 and 5 corresponding to methods (1), (2) and (3), respectively. In Tables 3–5, the symbol (*) indicates an undesirable sample. The symbol (x) indicates that the removal time required for removing the ceramic covering layer and restraint sheet is more than two hours, the symbol (Δ) indicates that the removal time is 1–2 hours, the symbol (o) indicates that the removal time is 0.5–1 hour, and the symbol (oo) indicates that the removal time is less than 0.5 hours. The ceramic covering layer and restraint sheet are removed by blasting fine alumina powder having average particle diameter of less than 32 μm under a blasting air-pressure of 5 kg/cm$^2$.

TABLE 3

| Exptl. Example | Glass No. | Thickness of surface covering paste applied (μm) | Pressing Step | Ease of removal of ceramic covering layer and restraint sheet (required time) | Planar shrinkage percentage (%) | Warpage (μm) |
| --- | --- | --- | --- | --- | --- | --- |
| *1 | 1 | 80 | Present | X | 0.03 | 185 |
| *2 | 1 | 80 | Absent | X | 0.04 | 190 |
| 3 | 1 | 48 | Present | Δ | 0.04 | 198 |
| 4 | 1 | 48 | Absent | Δ | 0.05 | 205 |
| 5 | 1 | 35 | Present | ○ | 0.05 | 210 |
| 6 | 1 | 35 | Absent | ○ | 0.06 | 227 |
| 7 | 1 | 25 | Present | ○ | 0.06 | 233 |
| 8 | 1 | 25 | Absent | ○ | 0.07 | 235 |
| 9 | 1 | 10 | Present | ○○ | 0.07 | 243 |
| 10 | 1 | 10 | Absent | ○○ | 0.08 | 245 |
| 11 | 1 | 5 | Present | ○○ | 0.08 | 250 |
| 12 | 1 | 5 | Absent | ○○ | 0.09 | 258 |
| 13 | 1 | 1 | Present | ○○ | 0.09 | 260 |
| 14 | 1 | 1 | Absent | ○○ | 0.1 | 263 |
| 15 | 2 | 5 | Present | ○○ | 0.08 | 260 |
| 16 | 3 | 5 | Present | ○○ | 0.08 | 265 |
| 17 | 4 | 5 | Present | ○○ | 0.08 | 300 |
| 18 | 5 | 5 | Present | ○○ | 0.08 | 355 |
| 19 | 6 | 5 | Present | ○○ | 0.08 | 335 |
| 20 | 7 | 5 | Present | ○○ | 0.08 | 345 |

As is apparent from Table 3, as compared with the case (see Table 2) where the restraint sheets are not used, the porcelain pieces generally exhibit a small degree of warpage. Table 3 also reveals that when the ceramic paste is applied too thick, the time consumed by the removing step shown in FIG. 4 increases significantly, thereby having an adverse effect on productivity.

TABLE 4

| Exptl. Example | Glass No. | Thickness of ceramic paste applied (μm) | Thickness of surface covering sheet (μm) | Pressing step | Ease of removal of ceramic covering layer and restraint sheet (required time) | Planar shrinkage percentage (%) | Warpage (μm) |
| --- | --- | --- | --- | --- | --- | --- | --- |
| *1 | 1 | 80 | 100 | Present | X | 0.03 | 180 |
| *2 | 1 | 50 | 100 | Absent | X | 0.04 | 190 |
| 3 | 1 | 50 | 50 | Present | Δ | 0.04 | 195 |
| 4 | 1 | 35 | 50 | Absent | Δ | 0.05 | 200 |
| 5 | 1 | 35 | 35 | Present | ○ | 0.05 | 210 |
| 6 | 1 | 25 | 35 | Absent | ○ | 0.06 | 225 |
| 7 | 1 | 25 | 25 | Present | ○ | 0.06 | 230 |
| 8 | 1 | 25 | 25 | Absent | ○ | 0.07 | 235 |
| 9 | 1 | 25 | 10 | Present | ○○ | 0.07 | 240 |
| 10 | 1 | 10 | 10 | Absent | ○○ | 0.08 | 245 |
| 11 | 1 | 10 | 10 | Present | ○○ | 0.08 | 245 |
| 12 | 1 | 5 | 10 | Present | ○○ | 0.08 | 247 |
| 13 | 1 | 5 | 10 | Present | ○○ | 0.09 | 245 |
| 14 | 1 | 1 | 10 | Present | ○○ | 0.08 | 255 |
| 15 | 1 | 1 | 10 | Present | ○○ | 0.08 | 258 |
| 16 | 1 | 10 | 5 | Present | ○○ | 0.08 | 250 |
| 17 | 1 | 10 | 5 | Absent | ○○ | 0.09 | 255 |
| 18 | 1 | 5 | 1 | Present | ○○ | 0.09 | 260 |
| 19 | 1 | 5 | 1 | Absent | ○○ | 0.1 | 260 |
| 20 | 2 | 10 | 5 | Present | ○○ | 0.08 | 260 |
| 21 | 3 | 10 | 5 | Present | ○○ | 0.08 | 260 |
| 22 | 4 | 10 | 5 | Present | ○○ | 0.08 | 300 |
| 23 | 5 | 10 | 5 | Present | ○○ | 0.08 | 350 |
| 24 | 6 | 10 | 5 | Present | ○○ | 0.08 | 330 |
| 25 | 7 | 10 | 5 | Present | ○○ | 0.08 | 340 |

As is apparent from Table 4, as compared with the case (see Table 2) where the restraint sheets are not used, the porcelain pieces generally exhibit a small degree of warpage. Table 4 also reveals that when the green ceramic covering layer (ceramic paste layer+second ceramic green sheet) is too thick, the time consumed by the removing step shown in FIG. 4 increases significantly, thereby having an adverse effect on productivity.

TABLE 5

| Exptl. Example | Glass No. | Thickness of surface covering sheet (μm) | Pressing step | Ease of removal of ceramic covering layer and restraint sheet (required time) | Planar shrinkage percentage (%) | Warpage (μm) |
|---|---|---|---|---|---|---|
| *1 | 1 | 100 | Present | X | 0.03 | 180 |
| *2 | 1 | 100 | Absent | X | 0.04 | 190 |
| 3 | 1 | 50 | Present | Δ | 0.04 | 195 |
| 4 | 1 | 50 | Absent | Δ | 0.05 | 200 |
| 5 | 1 | 35 | Present | ○ | 0.05 | 210 |
| 6 | 1 | 35 | Absent | ○ | 0.06 | 225 |
| 7 | 1 | 25 | Present | ○ | 0.06 | 230 |
| 8 | 1 | 25 | Absent | ○ | 0.07 | 235 |
| 9 | 1 | 10 | Present | ○○ | 0.07 | 240 |
| 10 | 1 | 10 | Absent | ○○ | 0.08 | 245 |
| 11 | 1 | 5 | Present | ○○ | 0.08 | 250 |
| 12 | 1 | 5 | Absent | ○○ | 0.09 | 255 |
| 13 | 1 | 1 | Present | ○○ | 0.09 | 260 |
| 14 | 1 | 1 | Absent | ○○ | 0.1 | 260 |
| 15 | 2 | 5 | Present | ○○ | 0.08 | 260 |
| 16 | 3 | 5 | Present | ○○ | 0.08 | 260 |
| 17 | 4 | 5 | Present | ○○ | 0.08 | 300 |
| 18 | 5 | 5 | Present | ○○ | 0.08 | 350 |
| 19 | 6 | 5 | Present | ○○ | 0.08 | 330 |
| 20 | 7 | 5 | Present | ○○ | 0.08 | 340 |

As is apparent from Table 5, as compared with the case (see Table 2) where the restraint sheets are not used, the porcelain pieces generally exhibit small degree of warpage. Table 5 also reveals that when the surface-layer-covering sheet (second ceramic green sheet) is too thick, the time consumed by the removing step shown in FIG. 4 increases significantly, thereby having an adverse effect on productivity.

It should further be apparent to those skilled in the art that various changes in form and detail of the invention as shown and described above may be made. It is intended that such changes be included within the spirit and scope of the claims appended hereto.

This application is based on Japanese Patent Application Nos. 2003-316789, 2003-316790 and 2003-317145 each filed Sep. 9, 2003, the above noted patent applications incorporated herein by reference in their entirety.

What is claimed is:

1. A method for producing a ceramic substrate, which comprises:
   (a) fabricating a green ceramic substrate comprising a laminate of ceramic green sheets and conductor layers, and surface conductors formed on a main surface of the laminate;
   (b) applying a ceramic paste to the green ceramic substrate so as to cover the surface conductors and the main surface of the laminate, the ceramic paste subsequently being integrated with the ceramic green sheets by cofiring;
   (c) laminating a restraint sheet on each of opposite sides of the green ceramic substrate to which the ceramic paste is applied, so as to restrain the green ceramic substrate, the restraint sheets containing a predominant amount of a sintering-resistant inorganic material, which is not sintered at a sintering temperature at which the green ceramic substrate is sintered;
   (d) firing the green ceramic substrate under restraint at a temperature at which the green ceramic substrate is sintered, whereas the restraint sheets are not sintered, to thereby yield a ceramic substrate restrained by means of the restraint sheets; and
   (e) removing, from the ceramic substrate restrained by means of the restraint sheets, the restraint sheets and a ceramic covering layer which is an upper portion of a ceramic layer formed from the ceramic paste applied in the covering step and which covers the surface conductors, to thereby expose the surface conductors, while leaving a lower portion of the ceramic layer formed from the ceramic paste applied in the covering step on the ceramic substrate.

2. The method for producing a ceramic substrate as claimed in claim 1, wherein the ceramic paste contains an inorganic material having substantially the same composition as that of the ceramic green sheets and an organic material serving as a solvent and a binder.

3. The method for producing a ceramic substrate as claimed in claim 1, wherein covering step (b) comprises pressing the side of the green ceramic substrate on which the surface conductors are formed so as to flatten the same, and subsequently applying the ceramic paste to the flattened side at a thickness of 1 μm to 50 μm.

4. The method for producing a ceramic substrate as claimed in claim 1, which further comprises (f) forming conductive bumps on corresponding surface conductors exposed by the removing step (e).

5. The method for producing a ceramic substrate as claimed in claim 1, which further comprises (g) forming a plating layer on surface conductors exposed by the removing step (e).

6. The method for producing a ceramic substrate as claimed in claim 1, wherein the ceramic substrate comprises an assembly of ceramic components to be divided into a plurality of ceramic components.

7. The method for producing a ceramic substrate as claimed in claim 1, which comprises removing the upper portion of the ceramic layer formed from the ceramic paste so as to leave a lower portion formed to the same height as that of the surface conductors.

8. A method for producing a ceramic substrate, which comprises:
   (a) fabricating a green ceramic substrate comprising a laminate of first ceramic green sheets and conductor layers, and surface conductors formed on a main surface of the laminate;
   (b) laminating a second ceramic green sheet on the green ceramic substrate so as to cover the surface conductors and the main surface of the laminate, the second ceramic green sheet subsequently being integrated with the first ceramic green sheets by cofiring;
   (c) laminating a restraint sheet on each of opposite sides of the green ceramic substrate covered with the second ceramic green sheet, so as to restrain the green ceramic substrate together with the second ceramic green sheet, the restraint sheets containing a predominant amount of a sintering-resistant inorganic material, which is not sintered at a sintering temperature at which the green ceramic substrate is sintered;

(d) firing the second ceramic green sheet and the green ceramic substrate under restraint at a temperature at which the second ceramic green sheet and the green ceramic substrate are integrally sintered, whereas the restraint sheets are not sintered, to thereby yield a ceramic substrate restrained by means of the restraint sheets; and (e) removing, from the ceramic substrate restrained by means of the restraint sheets, the restraint sheets and a ceramic covering layer which is an upper portion of a ceramic layer formed from the second ceramic green sheet and which covers the surface conductors, to thereby expose the surface conductors, while leaving a lower portion of the ceramic layer formed from the second ceramic green sheet on the ceramic substrate.

9. The method for producing a ceramic substrate as claimed in claim 8, wherein the inorganic material used to form the second ceramic green sheet and an inorganic material used to form the first ceramic green sheets have substantially the same composition.

10. The method for producing a ceramic substrate as claimed in claim 8, wherein covering step (b) comprises pressing the side of the green ceramic substrate on which a surface conductor layer is formed to flatten the same, and subsequently laminating the second ceramic green sheet having a thickness of 1 µm to 50 µm on the flattened side.

11. The method for producing a ceramic substrate as claimed in claim 8, which further comprises (f) forming conductive bumps on corresponding surface conductors exposed by the removing step.

12. The method for producing a ceramic substrate as claimed in claim 8, which further comprises (g) forming a plating layer on surface conductors exposed by the removing step.

13. The method for producing a ceramic substrate as claimed in claim 8, wherein the ceramic substrate comprises an assembly of ceramic components to be divided into a plurality of ceramic components.

14. The method for producing a ceramic substrate as claimed in claim 8, which comprises removing the upper portion of the ceramic layer formed from the second ceramic green sheet so as to leave a lower portion formed to the same height as that of the surface conductors.

15. A method for producing a ceramic substrate, which comprises:

(a) fabricating a green ceramic substrate comprising a laminate of first ceramic green sheets and conductor layers, and surface conductors formed on a main surface of the laminate;

(b) applying a ceramic paste to a surface of the green ceramic substrate on which surface conductors are formed to thereby form a paste coating layer and then laminating a second ceramic green sheet on the formed paste coating layer so as to cover the surface conductors and the main surface of the laminate with a green ceramic covering layer including the paste coating layer and the second ceramic green sheet, the ceramic paste subsequently being integrated with the green ceramic substrate by cofiring and the second ceramic green sheet subsequently being integrated with the paste coating layer by cofiring;

(c) laminating a restraint sheet on each of opposite sides of the green ceramic substrate covered with the green ceramic covering layer, so as to restrain the green ceramic substrate together with the green ceramic covering layer, the restraint sheets containing a predominant amount of a sintering-resistant inorganic material, which is not sintered at a sintering temperature at which the green ceramic substrate is sintered;

(d) firing the green ceramic covering layer and the green ceramic substrate under restraint at a temperature at which the green ceramic covering layer and the green ceramic substrate are integrally sintered, whereas the restraint sheets are not sintered, to thereby yield a ceramic substrate restrained by means of the restraint sheets; and (e) removing, from the ceramic substrate restrained by means of the restraint sheets, the restraint sheets and a ceramic covering layer which is an upper portion of a ceramic layer formed from the green ceramic covering layer and which covers the surface conductors, to thereby expose the surface conductors.

16. The method for producing a ceramic substrate as claimed in claim 15, wherein the ceramic paste contains an inorganic material having substantially the same composition as that of the first ceramic green sheets and an organic material serving as a solvent and a binder.

17. The method for producing a ceramic substrate as claimed in claim 16, wherein the inorganic material used to form the second ceramic green sheet and an inorganic material used to form the first ceramic green sheets have substantially the same composition.

18. The method for producing a ceramic substrate as claimed in claim 15, wherein covering step (b) comprises pressing the side of the green ceramic substrate on which a surface conductor layer is formed to flatten the same, and subsequently forming the green ceramic covering layer having a thickness of 1 µm to 50 µm on the flattened side.

19. The method for producing a ceramic substrate as claimed in claim 15, which further comprises (f) forming conductive bumps on corresponding surface conductors exposed by the removing step.

20. The method for producing a ceramic substrate as claimed in claim 15, which further comprises (g) forming a plating layer on surface conductors exposed by the removing step (e).

21. The method for producing a ceramic substrate as claimed in claim 15, wherein the ceramic substrate comprises an assembly of ceramic components to be divided into a plurality of ceramic components.

* * * * *